(12) United States Patent
Nagai et al.

(10) Patent No.: US 7,960,075 B2
(45) Date of Patent: Jun. 14, 2011

(54) PHOTOMASK UNIT, EXPOSING METHOD AND METHOD FOR MANUFACTURING SEMICONDUCTOR DEVICE

(75) Inventors: Satoshi Nagai, Kawasaki (JP); Kazuya Fukuhara, Tokyo (JP); Masamitsu Itoh, Yokohama (JP); Kenji Kawano, Yokohama (JP); Satoshi Tanaka, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 628 days.

(21) Appl. No.: 11/939,030

(22) Filed: Nov. 13, 2007

(65) Prior Publication Data
US 2008/0124633 A1 May 29, 2008

(30) Foreign Application Priority Data
Nov. 13, 2006 (JP) .................. 2006-307258

(51) Int. Cl.
*G03F 1/00* (2006.01)
*G02B 5/08* (2006.01)

(52) U.S. Cl. .......................................... 430/5; 359/359

(58) Field of Classification Search .............. 430/5, 30, 430/311; 355/53; 359/359, 562
See application file for complete search history.

(56) References Cited

U.S. PATENT DOCUMENTS

| | | | |
|---|---|---|---|
| 6,249,335 B1* | 6/2001 | Hirukawa et al. | 355/53 |
| 6,861,181 B1* | 3/2005 | Henderson | 430/5 |
| 7,271,950 B1* | 9/2007 | Gordon et al. | 359/359 |
| 2004/0137371 A1* | 7/2004 | Garza et al. | 430/311 |
| 2009/0059189 A1* | 3/2009 | Goehnermeier et al. | 355/30 |

FOREIGN PATENT DOCUMENTS

| | | |
|---|---|---|
| JP | 60-11843 | 1/1985 |
| JP | 7-199451 | 8/1995 |

* cited by examiner

*Primary Examiner* — Stephen Rosasco
*Assistant Examiner* — Stewart A Fraser
(74) *Attorney, Agent, or Firm* — Finnegan, Henderson, Farabow, Garrett & Dunner, L.L.P.

(57) ABSTRACT

A photomask unit includes a mask substrate having patterns arranged at a pitch P; and a pellicle which protects the mask substrate, wherein the pellicle is configured so that transmittance of incident light of an incident angle $\theta$ ($0°<\theta<90°$) is higher than transmittance of incident light of an incident angle $0°$.

19 Claims, 7 Drawing Sheets

PHOTOMASK UNIT, EXPOSING METHOD AND METHOD FOR MANUFACTURING SEMICONDUCTOR DEVICE

CROSS-REFERENCE TO RELATED APPLICATIONS

This application is based upon and claims the benefit of priority from prior Japanese Patent Application No. 2006-307258, filed Nov. 13, 2006, the entire contents of which are incorporated herein by reference.

BACKGROUND OF THE INVENTION

1. Field of the Invention

The present invention relates to a photomask unit, an exposing method and a method for manufacturing a semiconductor device.

2. Description of the Related Art

Photomask unit normally has a mask substrate (photomask main body) having formed thereon a mask pattern, and a pellicle provided to the mask substrate. The pellicle can protect a pattern forming surface of the mask substrate.

A film thickness, a refractive index and an extinction coefficient of the pellicle are adjusted so that transmittance of exposure light becomes as high as possible (for example, see Jpn. Pat. Appln. KOKAI Publication No. 7-199451). The refractive index and the extinction coefficient are called optical constants as long as there is no need to specify either of them. Normally, the film thickness and the refractive index are adjusted so that the transmittance of light incident on the pellicle vertically becomes as high as possible.

According to the miniaturization of mask patterns, however, an exposing method using off-axis illumination is required. In the off-axis illumination, exposure light is incident on the pellicle off-axially. For this reason, a conventional pellicle where only vertical incident light is taken into consideration cannot provide sufficient transmittance.

In such a manner, according to the miniaturization of the mask patterns, a decrease in the transmittance of the pellicles becomes a serious problem. For this reason, photomask units having a pellicle optimized for the off-axis illumination are desired.

BRIEF SUMMARY OF THE INVENTION

A first aspect of the present invention, there is provided a photomask unit comprising: a mask substrate having patterns arranged at a pitch P; and a pellicle which protects the mask substrate, wherein the pellicle is configured so that transmittance of incident light of an incident angle $\theta(0°<\theta<90°)$ is higher than transmittance of incident light of an incident angle 0°.

A second aspect of the present invention, there is provided an exposing method comprising: preparing the above photomask unit; and making exposure light with a wavelength $\lambda$ incident on the photomask unit at an incident angle $\theta$ to project patterns formed on the mask substrate onto a photoresist film though the pellicle.

A third aspect of the present invention, there is provided a method for manufacturing a semiconductor device, comprising: preparing the above photomask unit; preparing a semiconductor wafer with a photoresist film; making exposure light with a wavelength $\lambda$ incident on the photomask unit at an incident angle $\theta$ to project patterns formed on the mask substrate onto the photoresist film through the pellicle; developing the photoresist film to form a photoresist pattern; and carrying out etching by using the photoresist pattern as a mask.

DETAILED DESCRIPTION OF THE INVENTION

Embodiments of the present invention will be described below with reference to the drawings.

First Embodiment

Figure 1:
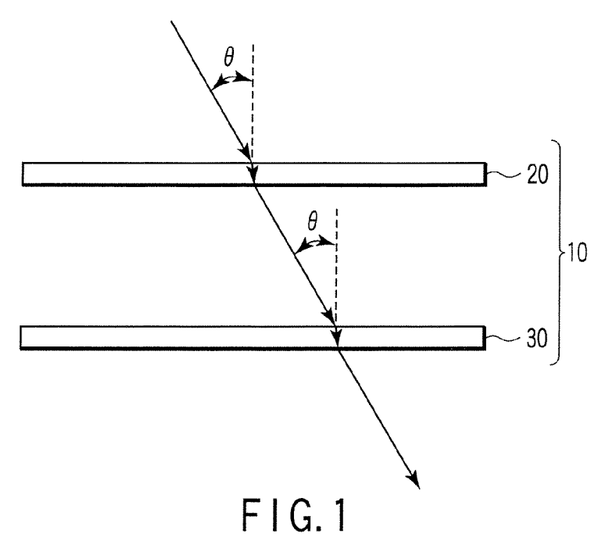
FIG. 1 is a diagram schematically illustrating a photomask unit according to a first embodiment of the present invention.

FIG. 1 is a diagram schematically illustrating a photomask unit according to a first embodiment of the present invention.

Figure 2:
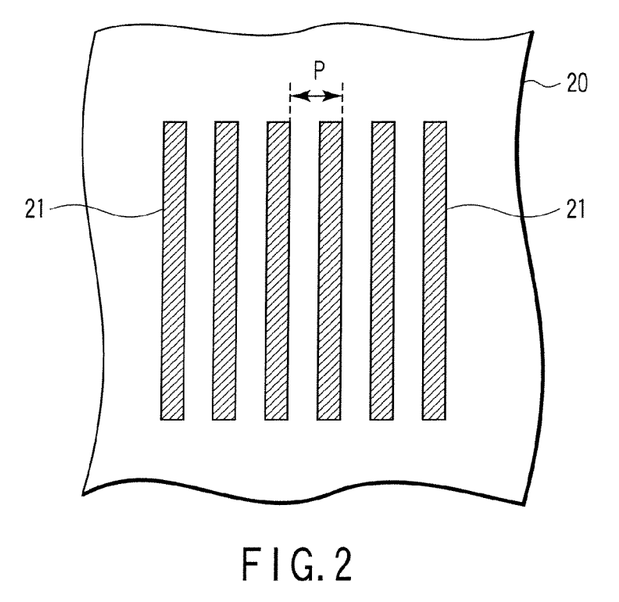
FIG. 2 is a plan view schematically illustrating a constitution of a mask substrate included in the photomask unit according to the first embodiment of the present invention.

FIG. 2 is a plan view schematically illustrating a constitution of a mask substrate included in the photomask unit shown in FIG. 1.

As shown in FIG. 1, a photomask unit 10 includes a mask substrate (photomask main body) 20 and a pellicle 30. The pellicle 30 is attached to the mask substrate 20, and the pellicle 30 protects a pattern forming surface of the mask substrate 20. The pellicle 30 is arranged in parallel with the mask substrate 20 so as to be separated from the mask substrate 20 by a constant distance.

Mask patterns 21 arranged at a pitch P are formed on the pattern forming surface of the mask substrate 20 as shown in FIG. 2. The mask substrate 20 includes the patterns 21 arranged at the pitch P as main patterns, and may include patterns which are not arranged at the pitch P.

The pellicle 30 is constituted so that its transmittance is locally maximum (relatively maximum) with respect to incident light of an incident angle $\theta$ defined by the following formula:

$$\sin \theta = \lambda/(2P) \quad (1)$$

where $\lambda$ is a wavelength of the incident light. That is, a film thickness and the optical constants of the pellicle 30 are set so that the transmittance becomes locally maximum at the incident angle $\theta$ defined by the formula 1. The pellicle 30 is desirably constituted so that the transmittance becomes maximum with respect to the incident light of the incident angle $\theta$. Further, the pellicle 30 is desirably constituted so that the transmittance of the incident light is not less than 99% at the incident angle $\theta$.

Figure 3:
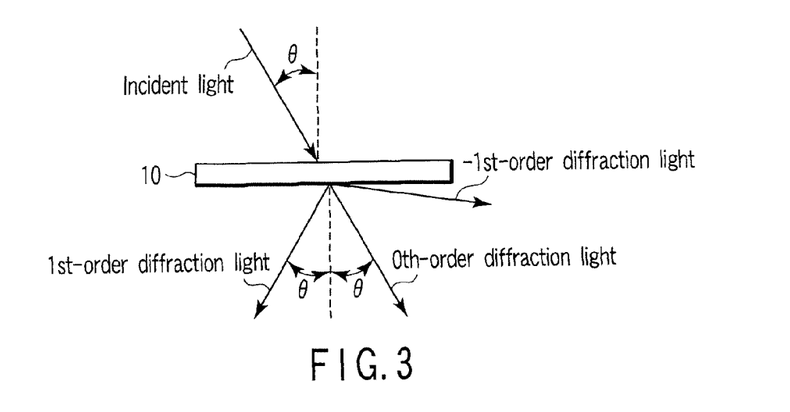
FIG. 3 is a diagram illustrating diffraction of exposure light according to the first embodiment of the present invention.

The formula 1 will be described with reference to FIG. 3. The wavelength of the incident light is denoted by $\lambda$, the pitch of the mask patterns is denoted by P, and the incident light is assumed to be incident on the photomask unit 10 at the incident angle $\theta$. An incident direction of the incident light (parallel with a paper surface) is vertical to an extending direction of the mask patterns (vertical to the paper surface). At this time, when the relationship of the formula 1 holds, an output angle (an angle defined by a 0th-order diffraction light and a normal line) of 0th-order diffraction light emitted from the photomask unit 10 becomes $\theta$. Further, an output angle (an angle defined by 1st-order diffraction light and a normal line) of 1st-order diffraction light emitted from the photomask unit 10 also becomes $\theta$. In general, the state when the light beams from different two directions, whose phases are aligned, interfere with each other is called two-beam interference state. When fine patterns having a dimension equivalent to or less than that of a light wavelength are formed, the two-beam interference state is almost always utilized. Specifically, when the incident light incident on the photomask patterns is projected onto the substrate, paths of the 0th-order diffraction light and the 1st-order diffraction light emitted from the photomask unit 10 are changed by a projection optical system, and the two-beam interference state is formed on the substrate. It is well known that when the output angle of the 0th-order diffraction light emitted from the photomask is equal to the output angle of the 1st-order diffraction light, a lithography margin can be made to be maximum. Therefore, when the fine mask patterns arranged at the pitch P are projected onto the substrate, an illumination optical system of an exposing apparatus is generally defined so as to include exposure light having an incident angle for satisfying the formula 1. As a result, it is understood that the design of the pellicle which makes the transmittance of light incident on the photomask unit becomes locally maximum at the incident angle expressed by the formula 1 is for making throughput maximum practically.

Figure 4:
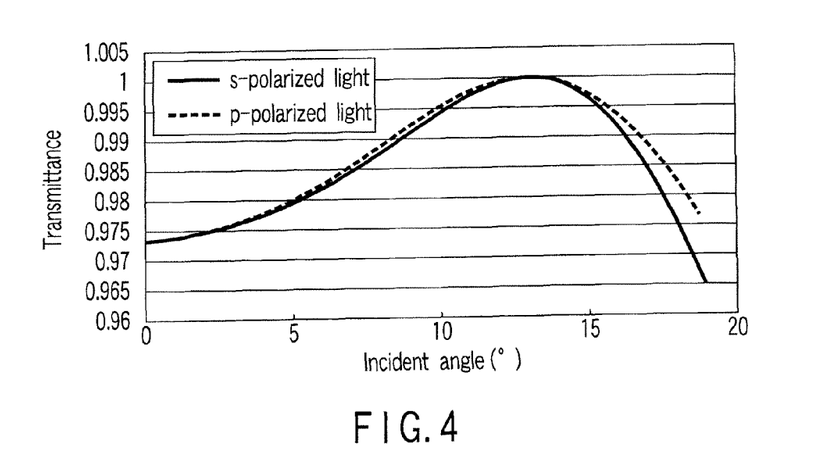
FIG. 4 is a diagram illustrating a transmittance characteristic of a pellicle according to the first embodiment of the present invention.
Figure 5:
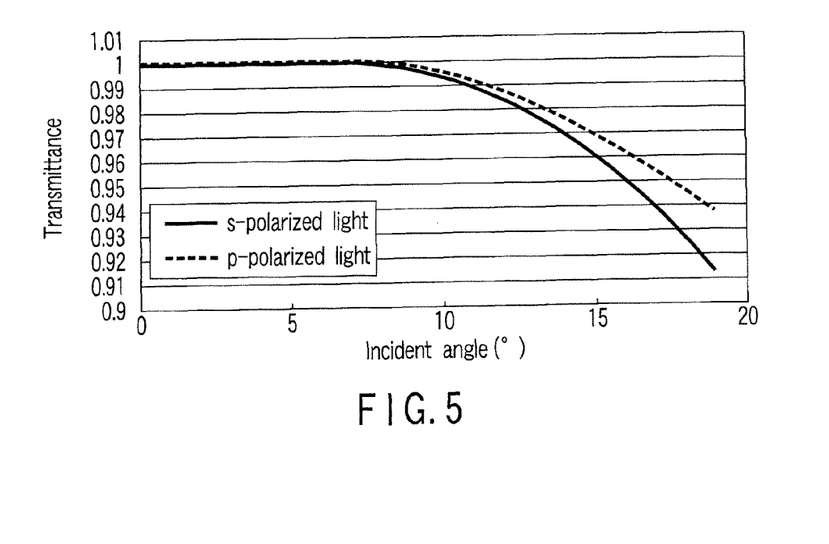
FIG. 5 is a diagram illustrating a transmittance characteristic of a pellicle according to a comparative example of the first embodiment of the present invention.

FIG. 4 is a diagram illustrating a transmittance property of the pellicle 30 according to the first embodiment. The film thickness and the refractive index of the pellicle 30 in the first embodiment is 840 nm and 1.4, respectively. The wavelength of the incident light is assumed to be 193.3 nm. Hereinafter, the wavelength is assumed to be 193.3 nm in portions other than the general description in which the wavelength is denoted by $\lambda$. FIG. 5 is a diagram illustrating the transmittance property of the pellicle according to a comparative example. The film thickness and the refractive index of the pellicle in the comparative example are 830 nm and 1.4, respectively. The incident angle of the incident light is plotted along an abscissa axis, and the transmittance (intensity transmittance) of the incident light is plotted along an ordinate axis.

The film thickness and the optical constants of a conventional pellicle are set so that the transmittance of light incident on the pellicle vertically becomes as high as possible. For this reason, as shown in FIG. 5, the transmittance becomes maximum at the incident angle of around 0°, and as the incident angle increases, the transmittance decreases.

The transmittance of the pellicle in the first embodiment is maximum at the incident angle of about 13° as shown in FIG. 4. The wavelength of the incident light is denoted by $\lambda$, the pitch of the mask patterns is denoted by P, and the following relationship holds:

$$\sin (13°) = \lambda/(2P)$$

In FIG. 4, the transmittance of s-polarized incident light and the transmittance of p-polarized incident light become maximum at the incident angle of about 13°. As to the s-polarized incident light and the p-polarized incident light, their incident angles at which the transmittance becomes maximum do not occasionally match with each other. In this case, as to a main polarized light component composing the exposure light, the film thickness and the optical constants of the pellicle are desirably determined so that the transmittance becomes maximum at 13°.

Figure 6:
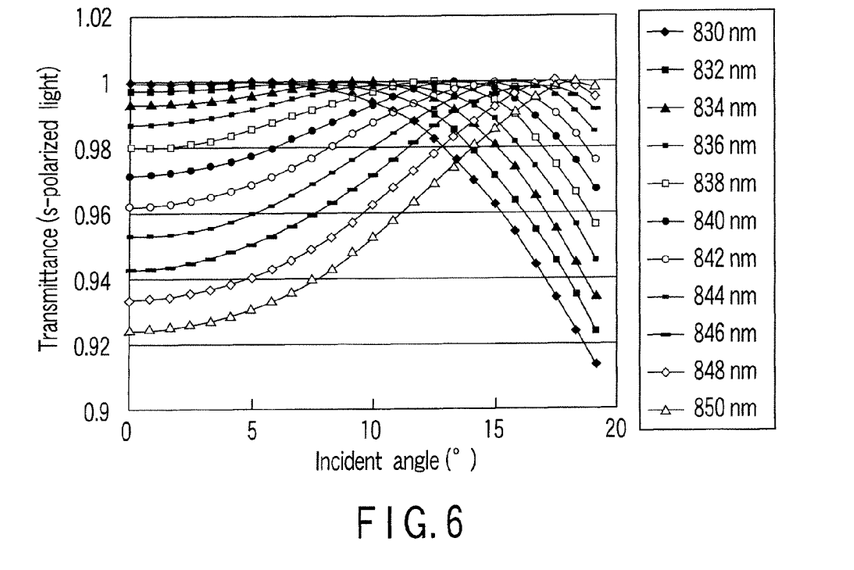
FIG. 6 is a diagram illustrating a transmittance characteristic of a pellicle when a film thickness is changed according to the first embodiment of the present invention.
Figure 7:
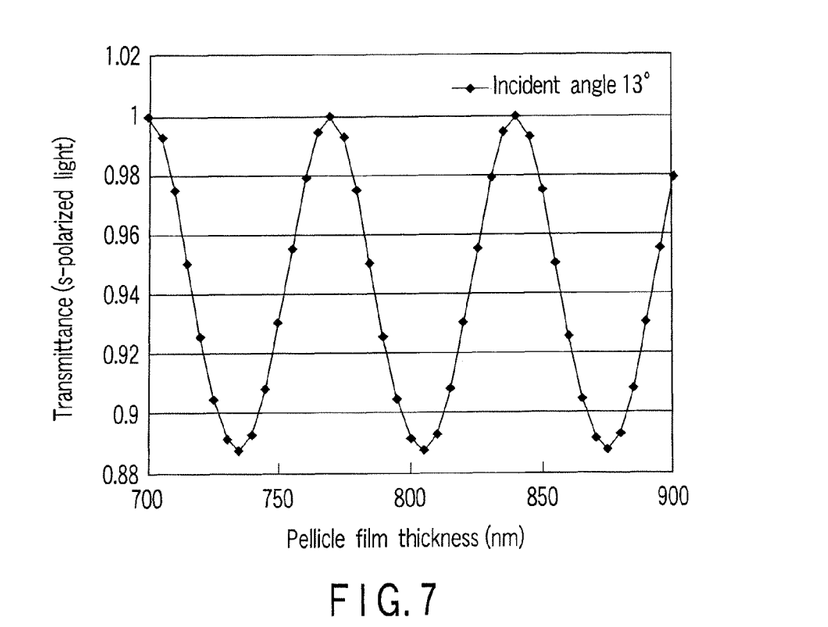
FIG. 7 is a diagram illustrating a relationship between the film thickness and the transmittance of the pellicle according to the first embodiment of the present invention.

FIG. 6 is a diagram illustrating a change in a relationship between the incident angle and the transmittance at the time when the film thickness is changed and the refractive index n of the pellicle is 1.4. As is clear from FIG. 6, it is desirable that the film thickness of the pellicle is set to about 840 nm in order to make the transmittance maximum at the incident angle of 13°. FIG. 7 is a diagram illustrating a relationship between the film thickness and the transmittance of the pellicle in a wider range where the refractive index n is 1.4 and the incident angle is 13°. As is clear from FIG. 7, the film thickness of the pellicle with which the transmittance becomes locally maximum is present periodically at intervals of about 70 nm. For this reason, any film thickness in FIG. 7 may be selected as long as the film thickness makes the transmittance maximum.

In the first embodiment, the film thickness and the optical constants of the pellicle 30 are set so that the transmittance becomes locally maximum at the incident angle $\theta$ defined by the formula 1. For this reason, when the exposure light is allowed to be incident on the pellicle obliquely, the exposure light transmits through the pellicle at high transmittance. For this reason, when the mask patterns are miniaturized and exposure is carried out by using off-axis illumination, a photoresist can be exposed sufficiently. According to the first embodiment, therefore, the fine patterns can be transferred onto the photoresist with high accuracy, and a throughput of the exposing step can be improved.

An exposing method and a method for manufacturing a semiconductor device which use the photomask unit will be described below.

Figure 8:
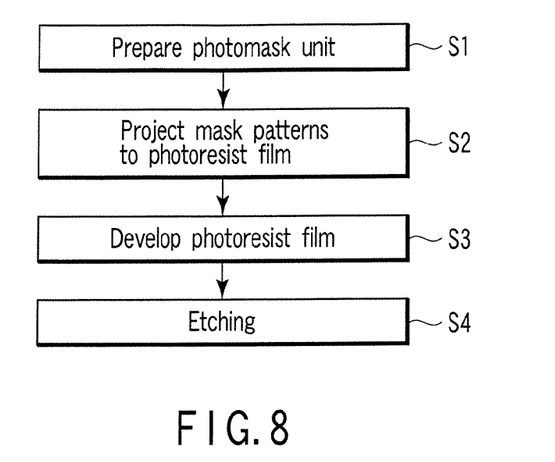
FIG. 8 is a flow chart schematically illustrating an exposing method and a method for manufacturing a semiconductor device according to the first embodiment of the present invention.
Figure 9:
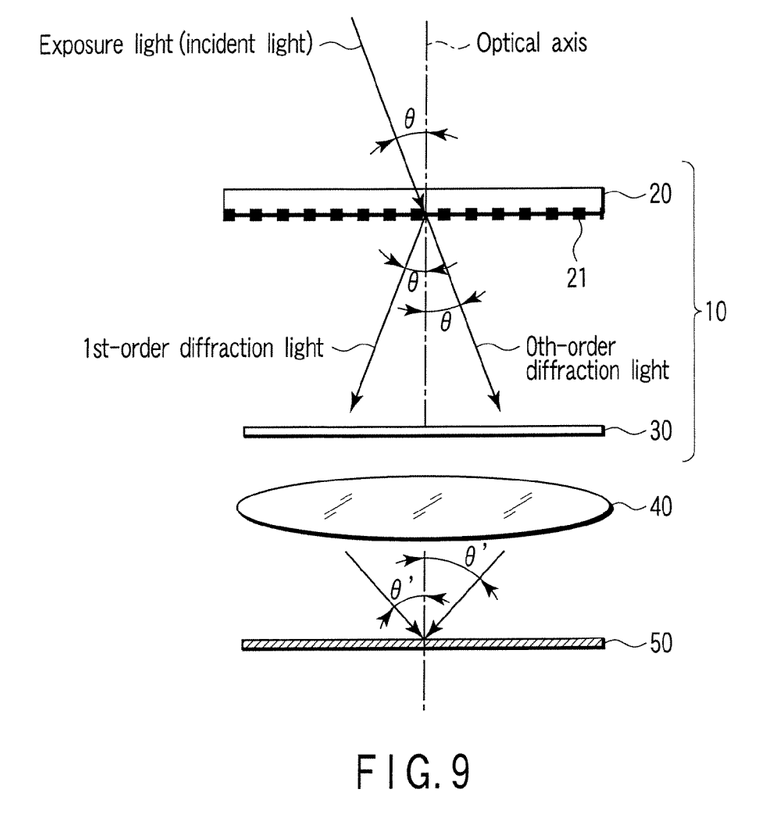
FIG. 9 is an explanatory diagram for explaining the exposing method and the method for manufacturing a semiconductor device according to the first embodiment of the present invention.

FIG. 8 is a flow chart schematically illustrating the exposing method and the method for manufacturing a semiconductor device according to the first embodiment. FIG. 9 is an explanatory diagram for explaining the exposing method and the method for manufacturing a semiconductor device according to the first embodiment.

The photomask unit 10 is prepared, which is set to the exposing apparatus (S1).

The mask patterns 21 formed on the mask substrate 20 of the photomask unit 10 are projected onto a photoresist film (not shown) on a semiconductor wafer 50 via the pellicle 30 and a projection lens 40 (S2).

Specifically, the exposure light (incident light) with wavelength λ is allowed to be incident on the mask substrate 20 at the incident angle θ. The incident light may include a light component which slightly shifts from the incident angle θ. As has been already described, the mask substrate 20 includes the mask patterns (line and space pattern) 21 arranged at the pitch P as main patterns. The relationship in the formula 1 holds among the incident angle θ, the wavelength λ and the pitch P. Therefore, 0th-order diffraction light of the output angle θ and 1st-order diffraction light of the output angle θ are emitted from the mask substrate 20 by a light diffracting function. Diffraction lights other than the 0th-order diffraction light and the 1st-order diffraction light are generated from the mask substrate 20, but when the pitch P of the mask patterns 21 is sufficiently small, these other diffraction lights are shielded by a diaphragm (not shown).

The exposure light (the 0th-order diffraction light and 1st-order diffraction light) emitted from the mask substrate 20 is incident on the pellicle 30 at the incident angle θ. The pellicle 30 is constituted so that the transmittance becomes locally maximum with respect to the incident light of the incident angle θ defined by the formula 1. For this reason, the exposure light (the 0th-order diffraction light and the 1st-order diffraction light) passes through the pellicle 30 at high transmittance.

The exposure light which has passed through the pellicle 30 is projected onto the photoresist film on the semiconductor wafer 50 via the projection lens 40. When the magnification of the projection lens 40 is M (for example, M=¼), an incident angle θ' of the exposure light with respect to the semiconductor wafer 50 satisfies the following relationship:

$$n_0 \times \sin \theta' = \sin \theta / M$$

where $n_0$ denotes refractive index of a medium provided between the projection lens and a substrate to be exposed. Both the 0th-order diffraction light and the 1st-order diffraction light are incident on the semiconductor wafer 50 in the two-beam interference state of the incident angle θ' and the mask patterns are projected to the semiconductor wafer 50. As a result, a depth of focus can be increased, and the lithography margin can be increased.

After the mask patterns 21 are projected to the photoresist film, the photoresist film is developed so that the photoresist patterns are formed (S3).

Thereafter, etching is carried out by using the photoresist patterns as a mask (S4). That is, a conductive film, an insulating film and the like formed on the semiconductor wafer 50 are etched by using the photoresist patterns as the mask.

Since the sufficient lithography margin and the sufficient exposure light amount can be secured by using the above-mentioned method, the fine patterns can be formed at high accuracy and high throughput.

Figure 10A:
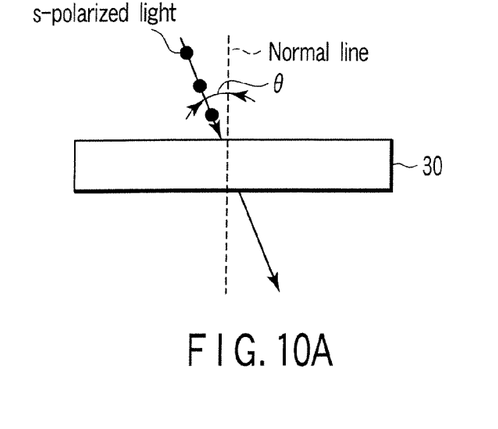
FIGS. 10A and 10B are diagrams illustrating oscillating directions of electric vectors of incident light incident on the pellicle according to the first embodiment of the present invention.
Figure 10B:
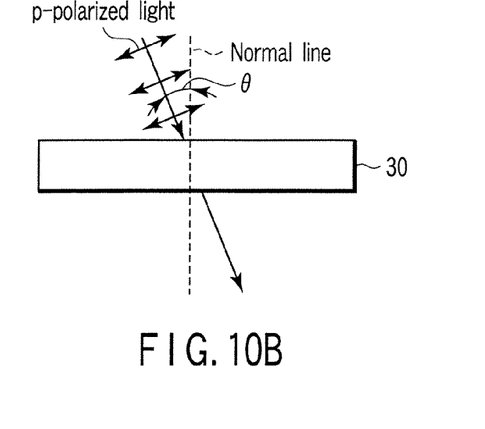

FIGS. 10A and 10B are diagrams illustrating examples of oscillating directions of electric vectors of the incident light incident on the pellicle 30. The incident light practically used for exposure light is linear polarization light in which the oscillating direction (polarization direction) of the electric vector of the incident light is vertical to the incident direction of the incident light (advancing direction of the incident light). As a special case of the linear polarization, FIG. 10A illustrates the incident light having s-polarization, and 10B illustrates the incident light having p-polarization. The polarization direction of the s-polarization is vertical to the incident plane, which includes the direction of the incident light and the normal line of the interface. On the other hand, that of the p-polarization is parallel to the incident plane. Since the exposure light utilizing the two-beam interference state is generally defined so as to include s-polarization light rather than p-polarization light, it is preferable that the characteristic of the transmittance of light incident on a pellicle described in a first embodiment is optimized for s-polarization light.

Figure 11:
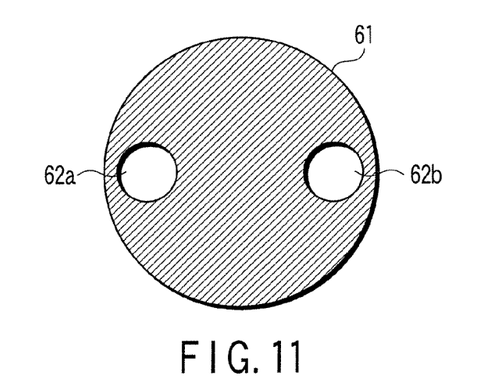
FIG. 11 is a diagram illustrating one example of an illumination shape of illumination light according to the first embodiment of the present invention.

FIG. 11 is a diagram illustrating one example of an illumination shape of illumination light incident on the mask substrate 20. FIG. 11 illustrates dipole illumination having two bright portions 62a and 62b in a dark portion 61. A positional relationship between the illumination and the mask patterns is adjusted so that a straight line which connects the center of the bright portion 62a and the center of the bright portion 62b is vertical (parallel with an arrangement direction of the mask patterns) to the extending direction of the mask patterns (for example, the mask patterns shown in FIG. 2). The center position of the bright portion 62a and the center position of the bright portion 62b are expressed as follows using σ value:

$$\sigma = \lambda/(2P \times NA)$$

where a numerical aperture of the projection lens on an exit side is denoted by NA. When such dipole illumination is used, the exposure light (illumination light) which satisfies the relationship in the formula 1 (sin θ=λ/(2P)) can be easily obtained.

Figure 12:
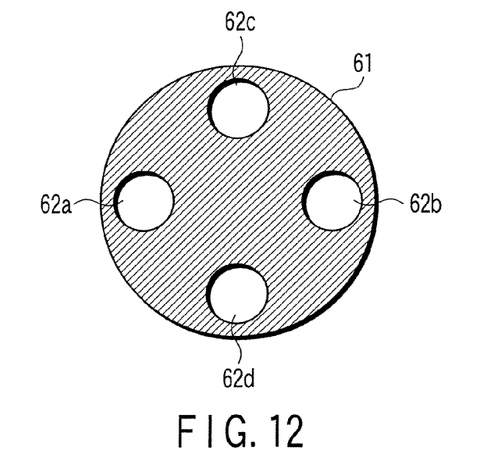
FIG. 12 is a diagram illustrating another example of an illumination shape of illumination light according to the first embodiment of the present invention.

FIG. 12 is a diagram illustrating another example of the illumination shape of the illumination light incident on the mask substrate 20. FIG. 12 illustrates quadrupole illumination having four bright portions 62a, 62b, 62c and 62d in the dark portion 61. Similarly to the example of FIG. 11, the positional relationship between the illumination and the mask patterns is adjusted so that a straight line which connects the center of the bright portion 62a and the center of the bright portion 62b is vertical to the extending direction of the mask patterns. The center position of the bright portion 62a and the center position of the bright portion 62b are similar to those in the example of FIG. 11. Also when such quadrupole illumination is used, the exposure light (illumination light) which satisfies the relationship in the formula 1 can be easily obtained. Similarly to the description about the bright portions 62a and 62b, the bright portions 62c and 62d are effective for patterns vertical to the patterns shown in FIG. 2. Therefore, when the mask pattern includes both the patterns shown in FIG. 2 and the patterns vertical to the patterns shown in FIG. 2, the quadrupole illumination shown in FIG. 12 is effective. That is, two pairs of the exposure light beams which satisfy the relationship of the formula 1 can be obtained simultaneously. Therefore, the photomask in the first embodiment is effective not only for the dipole illumination but also for the quadrupole illumination.

In the first embodiment, the numerical aperture (NA) of the projection lens 40 on the exit side is desirably not less than 1. Specifically, a medium (for example, a liquid such as water) having refractive index larger than 1 is interposed between the projection lens 40 and the semiconductor wafer 50, with the result that the numerical aperture (NA) of the projection lens 40 on the exit side can be set to not less than 1.

Second Embodiment

A second embodiment of the present invention will be described below. As to the matters described in the first embodiment, refer to the first embodiment, and the description thereof is omitted. That is, the basic matters are similar to those in the first embodiment.

Also in the second embodiment, similarly to the first embodiment, the photomask unit has the mask substrate having patterns and the pellicle which protects the mask substrate. The pellicle of the second embodiment is constituted so that a ratio of the transmittance fluctuation amount of the pellicle to the film thickness fluctuation amount of the pellicle becomes locally smallest with respect to a predetermined incident angle. That is, the film thickness and the refractive index of the pellicle are defined so that the ratio becomes minimum. This will be described specifically below.

The film thickness and the refractive index of the pellicle are denoted by d and n, respectively, and the wavelength and the incident angle of the light incident on the pellicle are denoted by $\lambda$ and $\theta$, respectively. The incident light is s-polarized light here. In the following description, an extinction coefficient of the pellicle is zero. In this case, when the Snell's law and the Fresnel formula are taken into consideration, the transmittance $T(d,\theta)$ of the incident light incident on the pellicle at the incident angle $\theta$ can be expressed by the following formula:

$$T(d,\theta) = (t^2 t'^2)/(1 - 2r^2 \cos \Delta + r^4) \quad (2)$$

where $$\Delta = 2\pi \times 2d(n/\lambda) \cos \theta'$$

$$\theta' = \sin^{-1}(\sin \theta/n)$$

t designates amplitude transmittance of the s-polarized light on an interface between air and the pellicle in the case where the light is incident on the pellicle from air. t' designates amplitude transmittance of the s-polarized light on the interface between air and the pellicle in the case where light is incident on air from the pellicle. r designates amplitude reflectance of the s-polarized light on the interface between air and the pellicle in the case where light is incident on air from the pellicle.

The ratio of the transmittance fluctuation amount of the pellicle to the film thickness fluctuation amount of the pellicle is considered. That is, in the formula (2), partial differentiation of the transmittance $T(d,\theta)$ with respect to the film thickness d is considered. The partial differentiation can be expressed by the following formula:

$$\partial T(d,\theta)/\partial d = -(8\pi n t^2 t'^2 r^2 (\sin \Delta)(\cos \theta'))/(1-2r^2 \cos \Delta + r^4)^2 \quad (3)$$

In the second embodiment, the pellicle is constituted so that the value of the formula (3) becomes minimum. That is, the film thickness d and the refractive index n of the pellicle are defined so that the value of the formula (3) becomes minimum.

Figure 13:
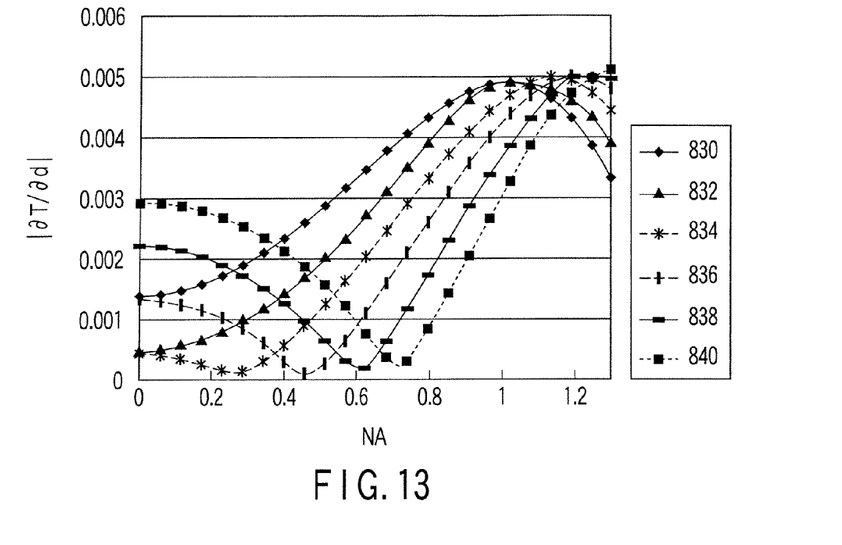
FIG. 13 is a diagram illustrating a transmittance fluctuation amount of a pellicle with respect to a film thickness fluctuation amount of the pellicle according to a second embodiment of the present invention.

FIG. 13 is a diagram illustrating a relationship between the incident angle $\theta$ and $\partial T(d,\theta)/\partial d$ when the film thickness d of the pellicle is changed. On an abscissa axis, the numerical aperture NA (NA is proportional to sin $\theta$, and NA=4 sin $\theta$) is used instead of the incident angle $\theta$. An ordinate axis shows an absolute value of $\partial T/\partial d$ ($(\partial T(d,\theta)/\partial d)$ is simplified). The refractive index n of the pellicle is 1.39. As is clear from FIG. 13, when the incident angle $\theta$ is determined, the film thickness d which makes the value of $\partial T/\partial d$ minimum can be obtained.

For example, similarly to the first embodiment, as shown in FIG. 2, it is assumed that the mask patterns 21 arranged at the pitch P are formed on the pattern forming surface of the mask substrate 20. In this case, as described in the first embodiment, when the following relationship holds as to the incident angle $\theta$ of the incident light, $$\sin \theta = \lambda/(2P) \quad (4)$$

the lithography margin can be set to a maximum value. Therefore, when the incident angle $\theta$ which satisfies the formula (4) is determined, the film thickness d of the pellicle which makes the value of $\partial T/\partial d$ minimum at the incident angle $\theta$ can be obtained.

As is clear from FIG. 7 of the first embodiment, there are generally a plurality of pellicle conditions (the film thickness and the refractive index) for making the transmittance maximum. In such a plurality of pellicle conditions, the pellicle conditions for making the value of $\partial T/\partial d$ minimum may be adopted. In this case, it is desirable to set the pellicle conditions for making the ratio of the transmittance fluctuation amount of the pellicle to the film thickness fluctuation amount of the pellicle minimum, including the case where the extinction coefficient is not zero.

Figure 14:
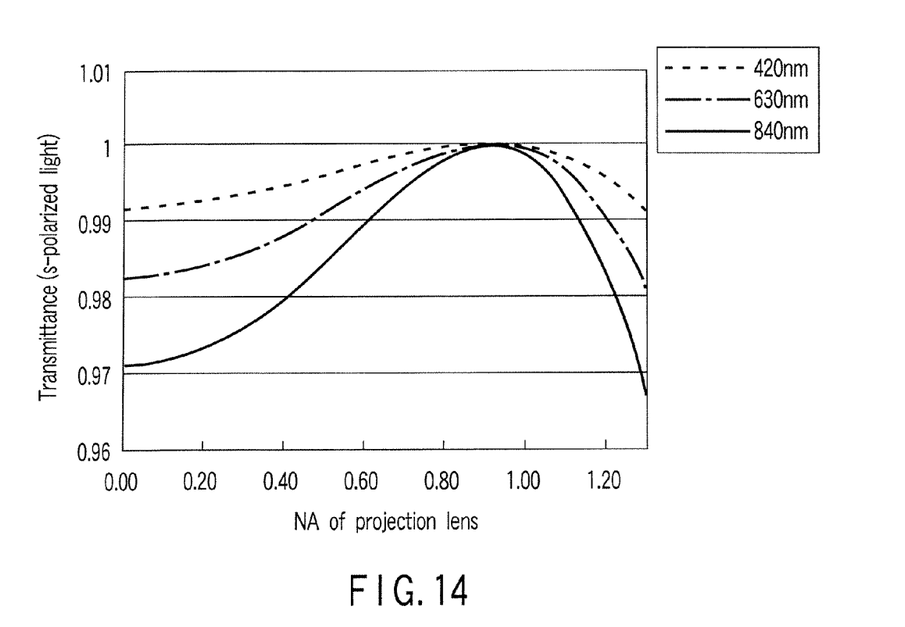
FIG. 14 is a diagram illustrating an incident angle dependence of the transmittance of the pellicle in the cases of three different optimal film thicknesses according to the second embodiment of the present invention.

FIG. 14 illustrates an incident angle dependency of the transmittance as to three pellicles having film thicknesses (420 nm, 630 nm and 840 nm) for making the transmittance maximum at the incident angle of about 13° (corresponding to NA=0.90) when the refractive index n=1.4. According to FIG. 14, it is found that the transmittance of not less than 99% can be obtained at the angle of about 13° as to any of the three film thicknesses. When the exposure is actually carried out by using the photomask unit having such pellicles, an attention should be paid to the fact that incident angle of the incident light ranges from 13°+several degrees to 13°−several degrees. Actually, the incident angle range defined by the following formula is sufficient:

$$\lambda/n_0 P - NA/n_0 \leq \sin \theta/(n_0 \times M) \leq NA/n_0$$

where NA designates the numerical aperture of the projection lens on an exit side, and $n_0$ designates the refractive index of the medium interposed between the projection lens and the substrate to be exposed and M designates the magnification of the projection lens. For example, when NA=1.3, $n_0$=1.43665 (the refractive index of water), the pitch P=176 mm and M=¼, the incident angle $\theta$ with respect to the pellicle may fall within a range of 13° to 19° (0.90 to 1.30 in NA).

Figure 15:
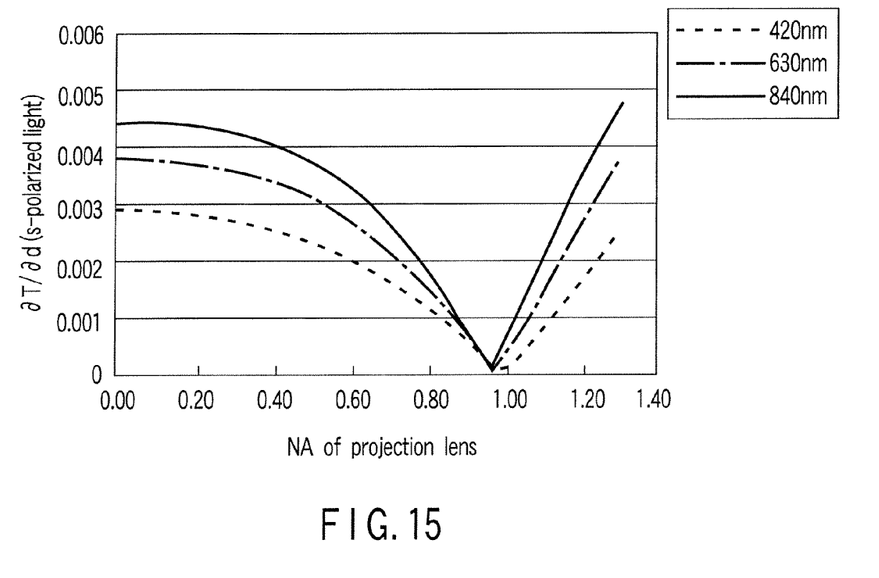
FIG. 15 is a diagram illustrating an incident angle dependence of $\partial T/\partial d$ of the pellicle in the cases of three different optimal film thicknesses according to the second embodiment of the present invention.

FIG. 15 illustrates the incident angle dependency of $\partial T/\partial d$. Normally, the value of $\partial T/\partial d$ is desirably not more than 0.003. As shown in FIG. 15, the value of $\partial T/\partial d$ is not more than 0.003 in the pellicle having film thickness of 420 nm with respect to the exposure light of the incident angle within the rang of 13° to 19° (0.90 to 1.30 in NA). Therefore, the pellicle having film thickness of 420 nm in the three pellicles is practically optimum.

As has been already described, in the second embodiment, the pellicle is constituted so that the ratio ($\partial T/\partial d$) of the transmittance fluctuation amount of the pellicle to the film thickness fluctuation amount of the pellicle becomes minimum. For this reason, even if the film thickness of the pellicle fluctuates, the transmittance fluctuation of the pellicle can be suppressed minimally. As a result, a dimension error caused by the film thickness fluctuation of the pellicle can be suppressed. Therefore, according to the second embodiment, even if the film thickness of the pellicle fluctuates, the fine patterns can be transferred to the photoresist at high accuracy.

The basic exposing method and method for manufacturing a semiconductor device using the above photomask unit are similar to those in the first embodiment shown in FIGS. 8 and 9.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A photomask unit configured to be used with incident light having a wavelength $\lambda$, the photomask unit comprising:
    a mask substrate having patterns arranged at a pitch P; and
    a pellicle which protects the mask substrate,
    wherein the pellicle is configured so that transmittance of incident light of an incident angle $\theta$ ($0°<\theta<90°$) is higher than transmittance of incident light of an incident angle $0°$, and further the pellicle is configured so that the transmittance is locally maximum with respect to incident light of the incident angle $\theta$, and the incident angle $\theta$ is defined by the following formula:

$$\sin\theta = \lambda/(2P).$$

2. The photomask unit according to claim 1, wherein a film thickness and an optical constant of the pellicle are set so that the transmittance of the incident light of the incident angle $\theta$ is higher than the transmittance of the incident light of the incident angle $0°$.

3. The photomask unit according to claim 1, wherein the transmittance of the pellicle is not less than 99% with respect to the incident light of the incident angle $\theta$.

4. The photomask unit according to claim 1, wherein a film thickness and an optical constant of the pellicle are set so that a ratio of a transmittance fluctuation amount of the pellicle to a film thickness fluctuation amount of the pellicle is not more than 0.003 (1/nm) when the incident angle of the incident light falls within a range of $(\theta-3)°$ to $(\theta+3)°$.

5. An exposing method comprising:
    preparing the photomask unit of claim 1; and
    making exposure light with the wavelength $\lambda$ incident on the photomask unit at the incident angle $\theta$ to project patterns formed on the mask substrate onto a photoresist film through the pellicle.

6. The exposing method according to claim 5, wherein a film thickness and an optical constant of the pellicle are set so that a ratio of a transmittance fluctuation amount of the pellicle to a film thickness fluctuation amount of the pellicle is not more than 0.003 (1/nm) within a range of an incident angle $\alpha$ defined by the following formula:

$$\lambda/n_0 P - NA/n_0 \leq \sin\alpha/(n_0 \times M) \leq NA/n_0$$

where NA designates a numerical aperture of a projection lens on the exit side in an exposing apparatus to be used when the patterns formed on the mask substrate are projected onto the photoresist film through the pellicle, $n_0$ designates a refractive index of a medium interposed between the projection lens and the photoresist film and M designates the magnification of the projection lens.

7. The exposing method according to claim 5, wherein the patterns formed on the mask substrate are projected onto the photoresist film in a two-beam interference state.

8. The exposing method according to claim 5, wherein an incident direction of the exposure light includes a direction vertical to an extending direction of the patterns.

9. The exposing method according to claim 5, wherein an oscillating direction of an electric vector of the exposure light includes a direction vertical to an incident plane of the exposure light.

10. The exposing method according to claim 5, wherein illumination which generates the exposure light is off-axis illumination.

11. The exposing method according to claim 5, wherein illumination which generates the exposure light has a first bright portion and a second bright portion.

12. The exposing method according to claim 11, wherein a straight line which connects a center of the first bright portion and a center of the second bright portion is vertical to an extending direction of the patterns.

13. A method for manufacturing a semiconductor device, comprising:
    preparing the photomask unit of claim 1;
    preparing a semiconductor wafer with a photoresist film;
    making exposure light with the wavelength $\lambda$ incident on the photomask unit at the incident angle $\theta$ to project patterns formed on the mask substrate onto the photoresist film through the pellicle;
    developing the photoresist film to form a photoresist pattern; and
    carrying out etching by using the photoresist pattern as a mask.

14. The method according to claim 13, wherein the pellicle is configured so that the transmittance is locally maximum with respect to incident light of the incident angle $\theta$.

15. The method according to claim 13, wherein a film thickness and an optical constant of the pellicle are set so that the transmittance of the incident light of the incident angle $\theta$ is higher than the transmittance of the incident light of the incident angle $0°$.

16. The method according to claim 13, wherein the transmittance of the pellicle is not less than 99% with respect to the incident light of the incident angle $\theta$.

17. A method for preparing a photomask unit to be used with incident light having a wavelength $\lambda$, the method comprising:
    preparing a mask substrate having patterns arranged at a pitch P; and
    preparing a pellicle for protecting the mask substrate, wherein the pellicle is prepared so that transmittance of light incident on the pellicle at an incident angle $\theta$ ($0°<\theta<90°$) is higher than transmittance of light incident on the pellicle at an incident angle $0°$, and further the pellicle is configured so that the transmittance is locally maximum with respect to incident light of the incident angle $\theta$, wherein the incident angle $\theta$ is defined by the following formula:

$$\sin\theta = \lambda/(2P).$$

18. The photomask unit according to claim 17, wherein a film thickness of the pellicle is chosen so that the transmittance of light incident on the pellicle at the incident angle $\theta$ is higher than the transmittance of light incident on the pellicle at the incident angle $0°$.

19. An exposure apparatus comprising:
    the photomask unit of claim 1; and
    a light source emitting exposure light at the wavelength $\lambda$, wherein the exposure light is incident on the photomask unit at the incident angle $\theta$ and projects patterns formed on the mask substrate through the pellicle.

* * * * *